US010360312B2

(12) United States Patent
Mattson et al.

(10) Patent No.: US 10,360,312 B2
(45) Date of Patent: Jul. 23, 2019

(54) SYSTEM AND METHOD FOR IDENTIFYING CLONES

(71) Applicant: Siemens Product Lifecycle Management Software Inc., Plano, TX (US)

(72) Inventors: Howard Charles Duncan Mattson, Cambridge (GB); Douglas Joseph King, Peterborough (GB); Jeremy Rogers, Cambridge (GB); Michael John Gibbens, Cambridge (GB)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 591 days.

(21) Appl. No.: 14/703,329

(22) Filed: May 4, 2015

(65) Prior Publication Data

US 2016/0328490 A1 Nov. 10, 2016

(51) Int. Cl.
| | |
|---|---|
| *G06F 17/50* | (2006.01) |
| *G06T 19/00* | (2011.01) |
| *G06K 9/00* | (2006.01) |
| *G06T 17/10* | (2006.01) |
| *G06F 17/30* | (2006.01) |

(52) U.S. Cl.
CPC ........ *G06F 17/50* (2013.01); *G06F 17/30224* (2013.01); *G06K 9/00* (2013.01); *G06T 17/10* (2013.01); *G06T 19/00* (2013.01)

(58) Field of Classification Search
None
See application file for complete search history.

(56) References Cited

U.S. PATENT DOCUMENTS

| | | | |
|---|---|---|---|
| 6,941,016 B1* | 9/2005 | Wagman | G06K 9/4638 382/149 |
| 9,607,108 B2 | 3/2017 | Mattson et al. | |

(Continued)

FOREIGN PATENT DOCUMENTS

| | | |
|---|---|---|
| JP | 2011248622 A | 12/2011 |
| WO | WO2009128898 A1 | 10/2009 |

OTHER PUBLICATIONS

Li, C. L., and Kin Chuen Hui. "Feature recognition by template matching." Computers & Graphics 24.4 (2000): 569-582.*

(Continued)

*Primary Examiner* — Bijan Mapar
(74) *Attorney, Agent, or Firm* — Lempia Summerfield Katz LLC

(57) ABSTRACT

Methods for identifying geometric clones in a modelling system, or simulating modifications to construction of a multi-part product and corresponding data processing systems and computer readable media. A method includes choosing a template of a geometric form and generating and storing a map of the template, identifying a candidate geometric form in the system and exploring the identified candidate geometric form from a start point until returning to the start point or reaching a branch. The method includes generating a map of the explored candidate geometric form, comparing the map of the explored candidate geometric form with the map of the template and labelling the candidate geometric form as a clone if it matches a predetermined portion of the template.

20 Claims, 14 Drawing Sheets

(56) References Cited

U.S. PATENT DOCUMENTS

| | | | |
|---|---|---|---|
| 2002/0004710 | A1 | 1/2002 | Murao |
| 2008/0269942 | A1 | 10/2008 | Free |
| 2009/0256842 | A1 | 10/2009 | Bohman et al. |
| 2012/0078581 | A1 | 3/2012 | Mattson et al. |

OTHER PUBLICATIONS

Temlyakov, Andrew, et al. "Two perceptually motivated strategies for shape classification." Computer Vision and Pattern Recognition (CVPR), 2010 IEEE Conference on. IEEE, 2010.*

Veltkamp, Remco C. "Shape matching: Similarity measures and algorithms." Shape Modeling and Applications, SMI 2001 International Conference on.. IEEE, 2001.*

Langerak, T. R., and J. S. M. Vergeest. "A new framework for the definition and recognition of free form features." Journal of Engineering Design 18.5 (2007): 489-504.*

Gavrila, Dariu M. "Multi-feature hierarchical template matching using distance transforms." Pattern Recognition, 1998. Proceedings. Fourteenth International Conference on. vol. 1. IEEE, 1998. (Year: 1998).*

Babic et al: "A review of automated feature recognition with rule-based pattern recognition"; Computers in Industry, Elsevier Science Publishers. Amsterdam, NL; vol. 59; No. 4; pp. 321-337, XP022504492; ISSN: 0166-3615, DOI:10.1016/J.COMPIND.2007.09.001; 2007.

K. Y. Lee, C. G. Armstrong, M.A. Price, and J. H. Lamont "A small Feature Suppression/Unsuppression System for Preparing BRepModels for Analysis" pp. 113-124, ACM 2005.

PCT International Search Report and Written Opinion of the International Searching Authority dated Aug. 9, 2016 for corresponding PCT/IB2016/051977.

PCT International Search Report and Written Opinion of the International Searching Authority dated Jul. 25, 2016 for corresponding PCT/IB2016/051976.

Description of FaceFinder in NX12. Siemens Product Lifecycle Management Software Inc.; 2017. p. 1-1.

Screen captures showing the Face Finder tool in various NX commands in NX 8.5—2009. Siemens Product Lifecycle Management Software Inc.; p. 1-6.

* cited by examiner

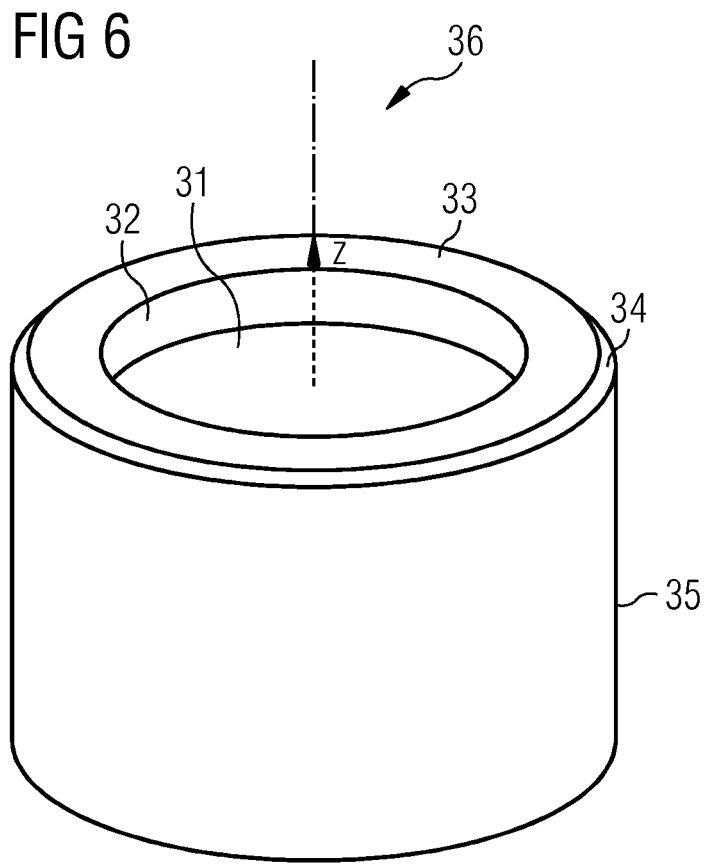

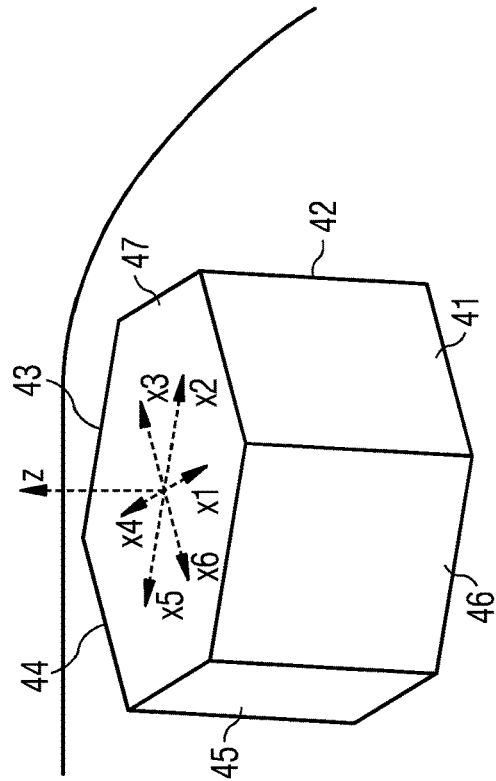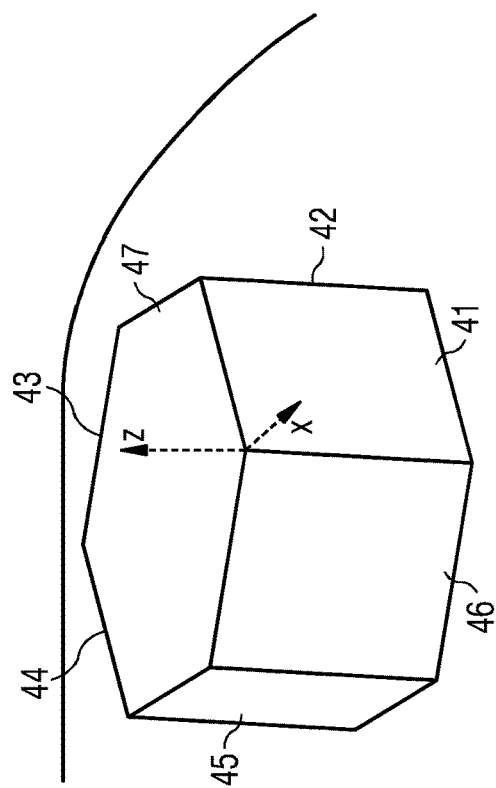

SYSTEM AND METHOD FOR IDENTIFYING CLONES

TECHNICAL FIELD

This present disclosure relates to the general field of computer aided design, drafting ("CAD"), manufacturing ("CAM") and visualisation systems (individually and collectively "CAD systems"), product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved methods and systems are desirable.

SUMMARY OF THE DISCLOSURE

Various disclosed embodiments include methods for identifying geometric clones in a modelling system, or simulating modifications to construction of a multi-part product.

A method includes choosing a template of a geometric form and generating and storing a map of the template. The method includes identifying a candidate geometric form in the system, exploring the identified candidate geometric form from a start point until returning to the start point or reaching a branch and generating a map of the explored candidate geometric form. The method includes comparing the map of the explored candidate geometric form with the map of the template and labelling the candidate geometric form as a clone if it matches a predetermined portion of the template.

A method includes choosing a template representing a sample, searching for candidates matching at least a predetermined portion of the template and labelling those candidates which match at least the predetermined portion of the template as geometric clones.

A method includes modelling the product using a model. The method includes selecting one part of the multi-part product and identifying geometric forms comprising geometric clones, or inverted geometric clones of the selected part in the model. The method includes labelling identified clones, applying a modification to the part and to the labelled geometric clones and providing a representation of the modified product.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

An example of method and data processing system according to the present disclosure will now be described with reference to the accompanying drawings in which:

FIG. 6 illustrates further detail in accordance with the disclosed embodiments;

FIGS. 7a and 7b illustrate another sample and clone in accordance with the disclosed embodiments;

DETAILED DESCRIPTION

Figure 1:
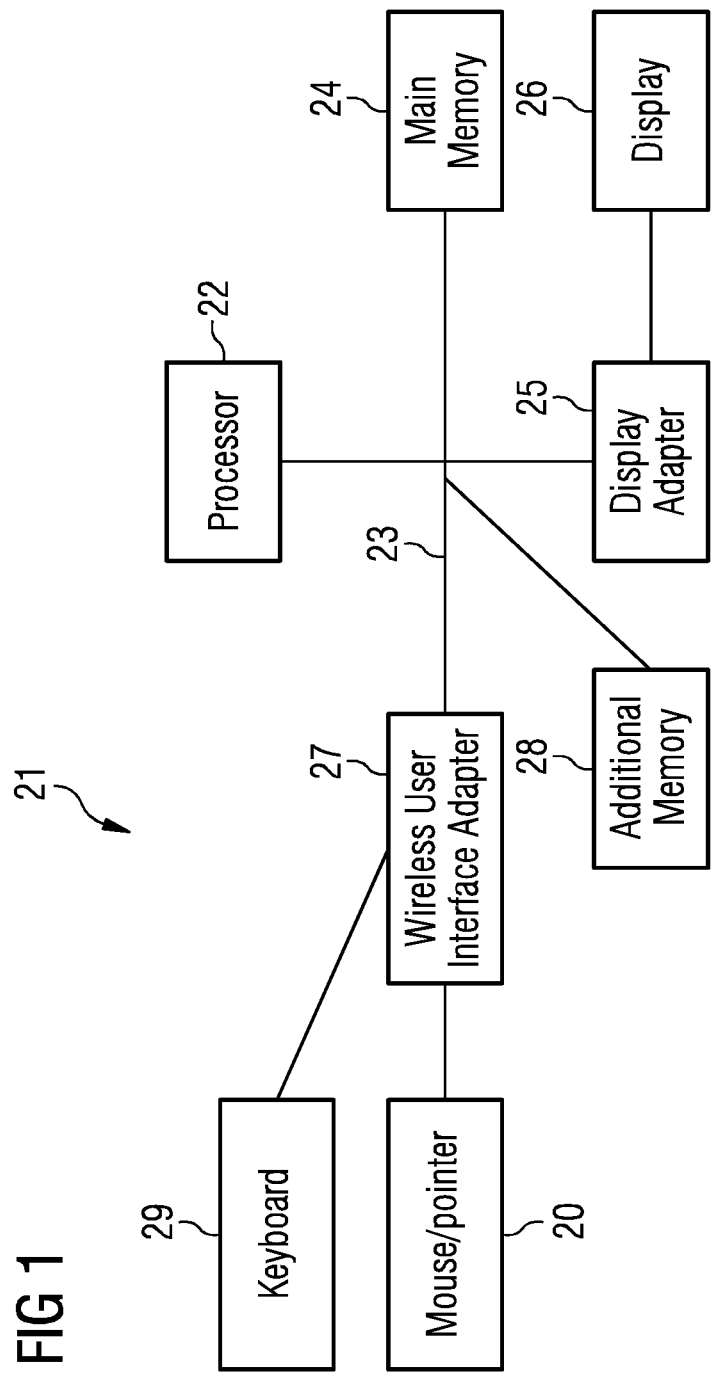
FIG. 1 is a block diagram of a data processing system in which an embodiment can be implemented.

The embodiments of FIGS. 1 to 19 used to describe the principles of the present disclosure in this document are by way of illustration only and should not be construed in any way to limit the scope of the disclosure. Those skilled in the art will understand that the principles of the present disclosure may be implemented in any suitably arranged device.

In CAD systems, a user may wish to model a design for an object, carry out tests to determine the behaviour of that object and modify the design in response to the outcome of the tests. At certain stages in the design process, the user may wish to make changes and then revert to the original, if the outcome is not as expected, or to trial a number of different changes in succession to determine which is to be used. However, the user is resistant to activities with long delays. Certain processes may be performed individually on elements of the design which are geometrically similar, wasting time and computing power. However, identifying such design elements manually is difficult and time consuming and in some cases just may not be practical to do.

Direct modelling, or variational direct modelling may be used in any case where an object or article is represented as a solid, including machine parts, vehicles, equipment installations, building layouts, engineering structures, or chemical structures, but the disclosure is not limited to these applications. A three dimensional model allows mass, or weight of parts to be derived and interaction with other components in other systems can be determined. A variational direct modelling system describes the parameters of and relationships between features in an object model in terms of geometric constraints and dimensions. Such systems then use a solver process to process these constraints and dimensions, along with a multitude of ancillary constraints and dimensions required to maintain design intent, and the entire model is solved simultaneously.

The present disclosure describes how to determine geometrically similar elements and associate these in such a way that they can be treated in a similar fashion in terms of processing, without each individual element having to be processed separately. The method automatically and rapidly determines whether or not an element which is geometrically similar to a given template exists within a specified environment. For the purpose of this description, such a geometrically similar element will be referred to as a geometric clone. Operations are more efficient when similar geometric forms can be identified and so behave similarly or be grouped and processed together.

In a complex body such as an electrical machine, or a vehicle, or aircraft, there may well be multiple instances of parts which have a similar geometry. When modelling this complex body, each individual part is processed according to the changes which the designer wishes to apply. However, these changes all add to the computing requirement and extend the time required before an updated model can be rendered, after which the designer may wish to apply further tests to determine the validity of his design strategy. Reducing the time that this takes is beneficial. This is achieved by identifying geometric clones and labelling these so that during the processing phase, design changes can be applied to a designated template element or part and after the change has been applied, the effect is then copied to all clones of the template which have been identified.

FIG. 1 illustrates an example of a data processing system in which an embodiment of the present disclosure may be implemented, for example a CAD system configured to perform processes as described herein. The data processing system 21 comprises a processor 22 connected to a local system bus 23. The local system bus connects the processor to a main memory 24 and graphics display adaptor 25, which may be connected to a display 26. The data processing system may communicate with other systems via a wireless user interface adapter connected to the local system bus 23, or via a wired network, e.g. to a local area network. Additional memory 28 may also be connected via the local system bus. A suitable adaptor, such as Wireless User Interface Adapter 27, for other peripheral devices, such as a keyboard 29 and mouse 20, or other pointing device, allows the user to provide input to the data processing system. Other peripheral devices may include one or more I/O controllers such as USB controllers, Bluetooth controllers, and/or dedicated audio controllers (connected to speakers and/or microphones). It should also be appreciated that various peripherals may be connected to the USB controller (via various USB ports) including input devices (e.g., keyboard, mouse, touch screen, trackball, camera, microphone, scanners), output devices (e.g., printers, speakers), or any other type of device that is operative to provide inputs or receive outputs from the data processing system. Further it should be appreciated that many devices referred to as input devices or output devices may both provide inputs and receive outputs of communications with the data processing system. Further it should be appreciated that other peripheral hardware connected to the I/O controllers may include any type of device, machine, or component that is configured to communicate with a data processing system.

An operating system included in the data processing system enables an output from the system to be displayed to the user on display 26 and the user to interact with the system. Examples of operating systems that may be used in a data processing system may include Microsoft Windows™, Linux™, UNIX™, iOS™, and Android™ operating systems.

In addition, it should be appreciated that data processing system 21 may be implemented as in a networked environment, distributed system environment, virtual machines in a virtual machine architecture, and/or cloud environment. For example, the processor 22 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system 21 may vary for particular implementations. For example the data processing system 21 in this example may correspond to a computer, workstation, and/or a server. However, it should be appreciated that alternative embodiments of a data processing system may be configured with corresponding or alternative components such as in the form of a mobile phone, tablet, controller board or any other system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

The data processing system 21 may be connected to the network (not a part of data processing system 21), which can be any public or private data processing system network or combination of networks, as known to those of skill in the art, including the Internet. Data processing system 21 can communicate over the network with one or more other data processing systems such as a server (also not part of the data processing system 21). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Figure 2:
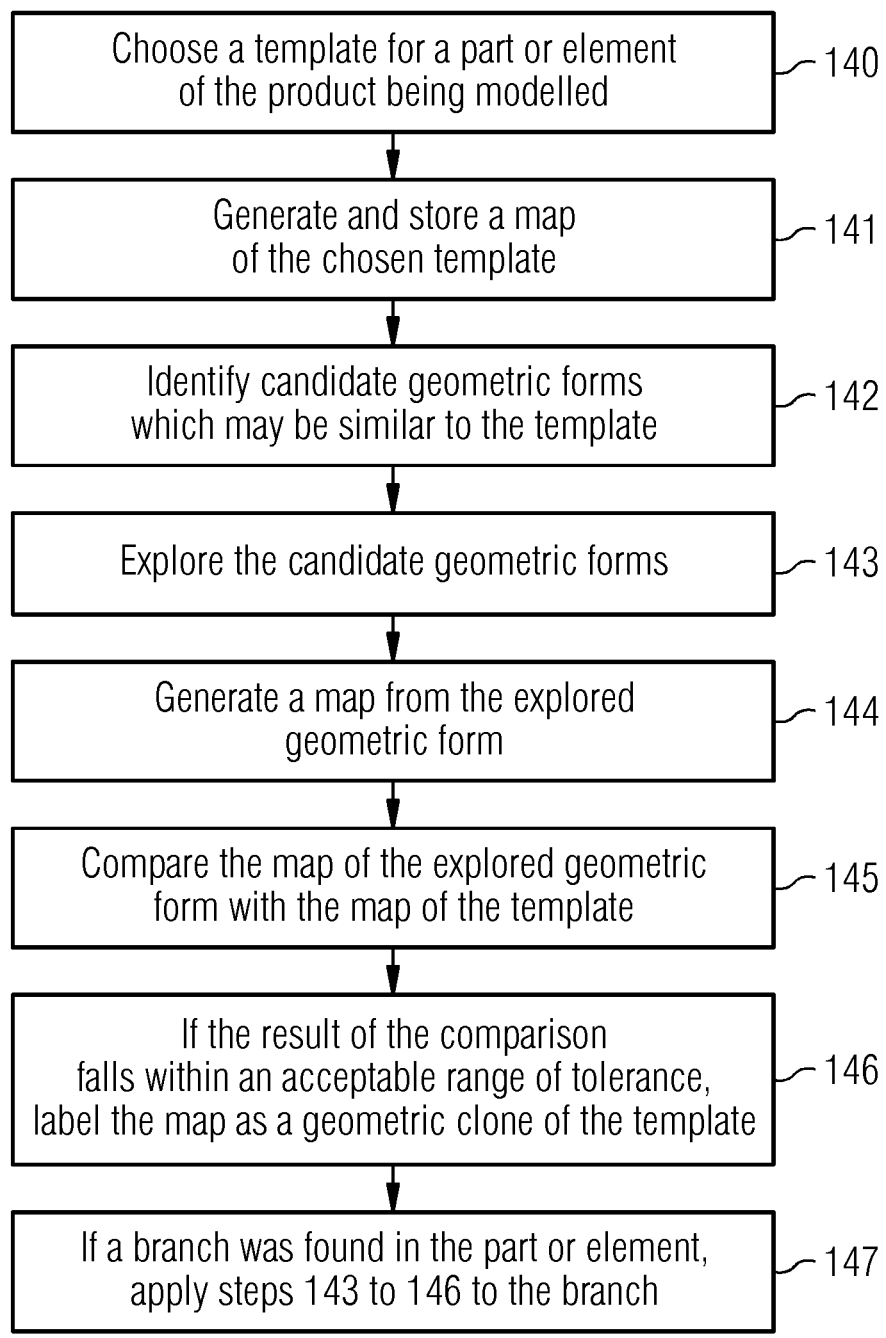
FIG. 2 is a flow diagram of a process in accordance with disclosed embodiments.

FIG. 2 is a flow diagram of a basic method illustrating the disclosure. The first step is to choose 140 a template for the part of the product which is being modelled, for example a cog teeth, or a nut, or a washer. Identifying geometric clones is most useful when considering parts which are present in multiple instances in the product. Having chosen the template, a mathematical map of the faces of the part represented by the template is generated 141. The map indicates each of the faces or edges encountered by exploring the template faces or edges sequentially. The map for the template is stored for later use. Candidate geometric forms which may be similar to the template are identified 142, for example by determining face and edge pairs which match a designated start face and edge of the template. In a two dimensional example, the template may comprise edges and vertices. In a three dimensional example, the template comprises edges and faces.

Each identified candidate is explored 143 and a map for each candidate is generated 144 in a similar manner. In this example, the exploring comprises following the boundary of the start face, checking edges and adding new faces as they are detected. Each map is compared 145 with the map for the template. A range of tolerance which has been preset is used to determine whether the map of a candidate is within the range of tolerance which permits it to be deemed to be geometrically similar to the template. If the result falls within the acceptable range, then the modelled part is labelled as a geometric clone. If the result does not fall within the acceptable range, the candidate is discarded. The tolerance range may include a requirement for a specific portion of the template to be matched, or the tolerance range may comprise a minimum number of matches of the template and the candidate. For parts which are deemed to be geometrically similar a further check is made to see if any branches were encountered and if so, the process of exploring 143, mapping 144 and comparing 145, 146 is carried out 147 for each branch. More detail of the operation of the method is provided hereinafter.

Figure 3:
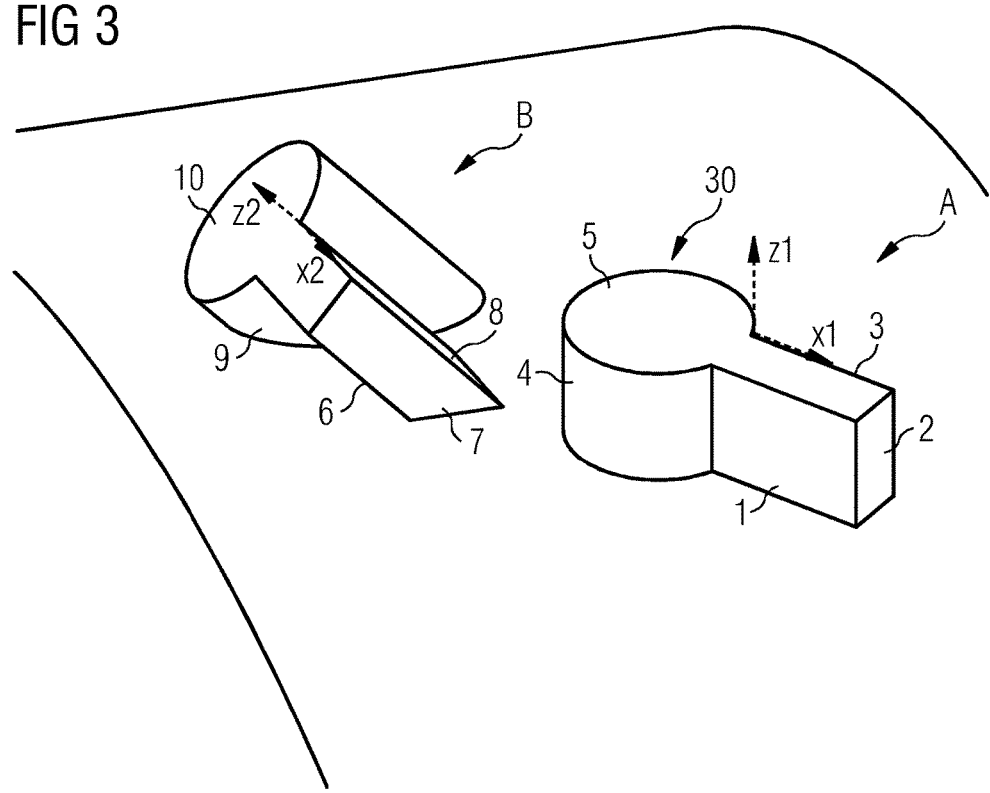
FIG. 3 illustrates an example of a sample from which a template is produced and a potential clone, in accordance with disclosed embodiments.

Given a set of template faces, this method rapidly identifies geometric clones together with their face mappings and consistent coordinate frames. The template faces are generally connected with a boundary to the environment and the clones are rigid transformations except at the boundary where they may vary. An example of a template and clone is shown here together with the face mapping and consistent coordinate frames. FIG. 3 illustrates a first example of a part A from which a template may be formed and then compared with a candidate part B to see if that part B can be deemed to be geometrically similar to part A. The sample part A has a connected set of faces 1, 2, 3, 4, 5 and the potential clone candidate part B has a connected set of faces 6, 7, 8, 9. 10. The aim is to find geometric clones, so treatment faces at the boundary, such as blends and chamfers are ignored in the basic determination, as these take different geometric forms in each instance. This can be seen in FIG. 4. The faces in the set, excluding any treatments, may be referred to as the 'template' and a subset of these that neighbour non-template faces are boundary faces. The edges between boundary faces and non-template faces are boundary edges and these may be collected into connected sets called boundary regions. Face 5 is a non-boundary face, faces 4, 1, 2, 3 are boundary faces and faces 11 are ignored because they are treatments.

The process starts by choosing a start face and edge from the set. In FIG. 3, the start face chosen is labelled 5 and axes z1, x1 are indicated. An edge may be chosen, for example circular edge 30. The axes do not have to correspond to an edge. The start face and start edge chosen from the template start the process of graph building and matching. The choice of start face or start edge aims to reject unsuitable candidates as early as possible and optimise performance. For example, the circular edge 30 has a radius property which can be checked. A basic choice of start face to give good performance in a wide variety of situations is to choose based on likely rarity of the face itself according to a set of quickly testable local properties that are used when initially comparing them to the environment. This is in order that, at the later matching stage, candidate starting locations within the environment are at a minimum.

Figure 4:
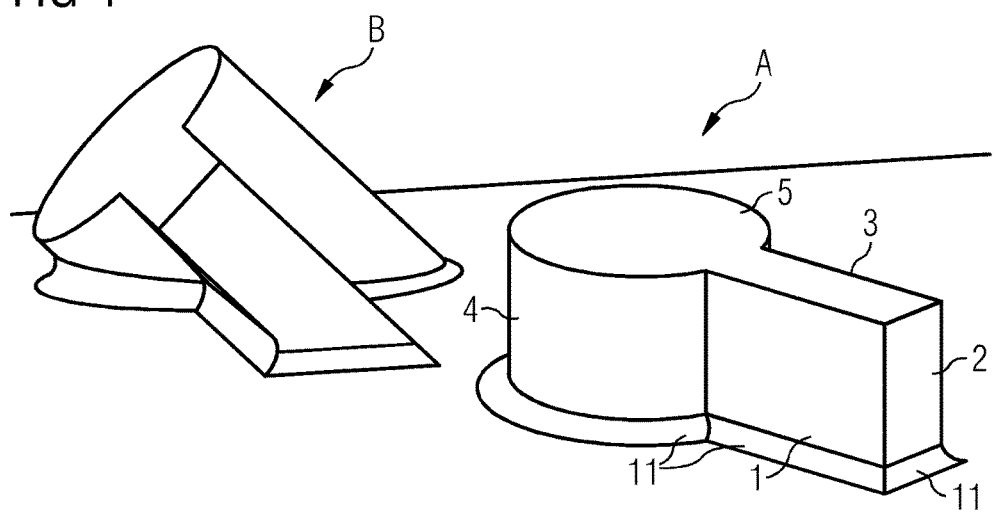
FIG. 4 provides more detail of the embodiment of FIG. 3.
Figure 5:
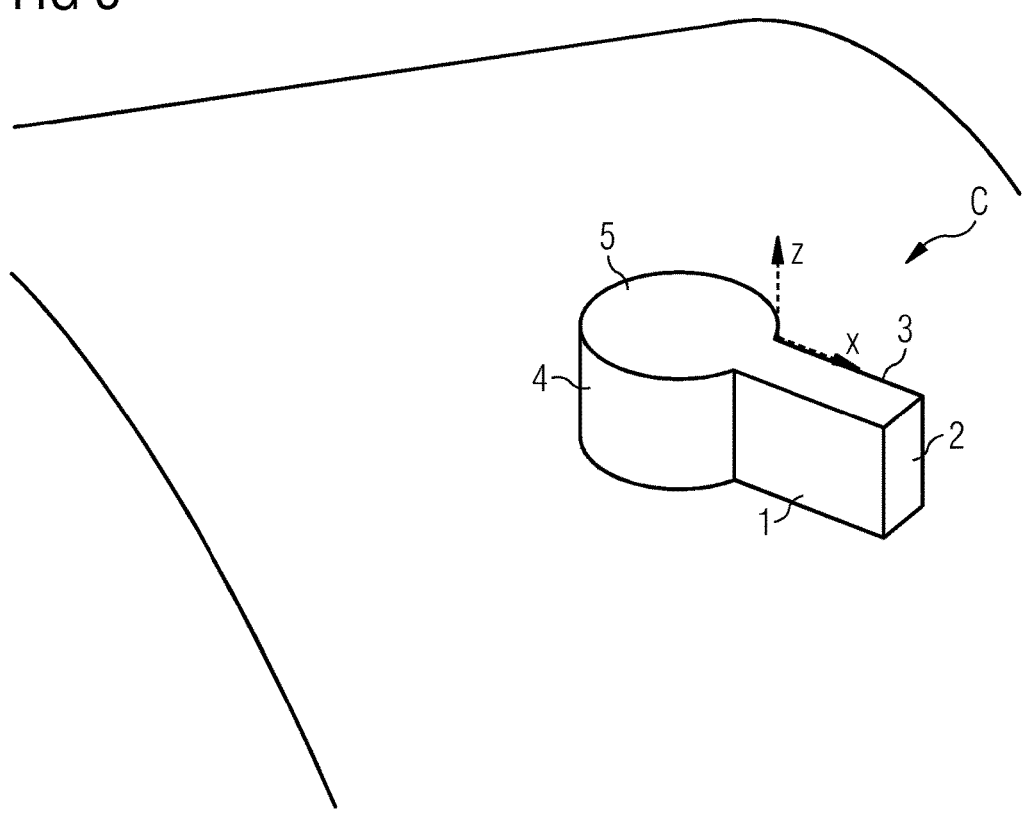
FIG. 5 provides more detail of the embodiment of FIG. 3.
Figure 8A:
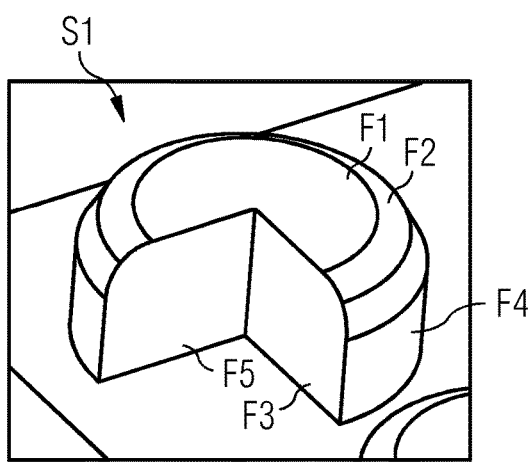
FIGS. 8a and 8b illustrate another sample and clone in accordance with the disclosed embodiments.
Figure 8B:
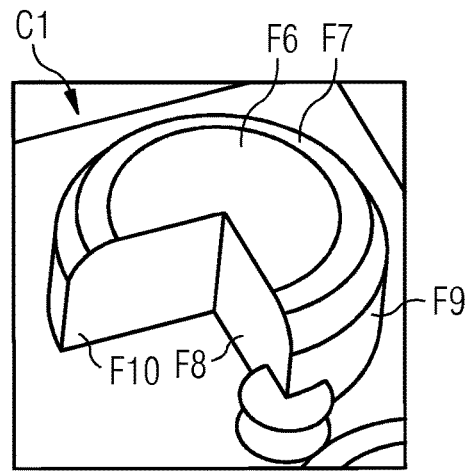

There are various properties that can be used in choosing a start face and edge, including, but not limited to, searching for non-boundary faces and edges, which are preferable as their whole boundary can be used in testing. Using boundary faces instead is more complex. FIG. 4 illustrates examples of each. This shows one non-boundary face 5, four boundary faces 4, 1, 2, 3 and a number of treatment faces 11. Another property is geometry type, for example, planes are very common and have no further properties to quickly check, whereas tori are rarer and also have two radii that can be checked very quickly. A property, such as edge count or loop count may be used; for example, a face with a large number of edges is fairly rare and serves as a better basis for checking than a face with four edges.

An orthonormal coordinate frame, consisting of an origin, a Z direction and an X direction, is created from the template faces, i.e. z1, x1 in FIG. 3. The corresponding coordinate frame on a given candidate clone is created, illustrated as z2, x2 in FIG. 3 with a given mapping to the template faces, as shown in the table 1 below. This allows a transform to be computed and used in the final exact geometric check. The origin chosen is typically a stable point, for example, an internal vertex, the centre of a geometry, or a parametric point on a non-analytic geometry. The Z direction may be an internal edge direction, the axial direction of a geometry, the normal of a plane, or the direction to another stable point. The X direction must be orthogonal to the Z direction, but can use similar types of point, or directions, as for the origin in the Z direction, but projected to the Z plane.

TABLE 1

|  | Sample | | | | |
| --- | --- | --- | --- | --- | --- |
|  | 1 | 2 | 3 | 4 | 5 |
| Clone | 6 | 7 | 8 | 9 | 10 |

A topological graph is built to include all the faces, edges and loops of the template, attributed with local properties that are quick to check when matching and potentially including but not limited to: geometric type, geometric parameters, such as radii, half angle etc, loop count, loop type, edge counts, edge length, total edge/chord length, edge angle, convexity, etc. The choice of properties to include may vary, for example a boundary face will not compare edge count, so is chosen dynamically when building the graph. The order in which the properties are created is also important, and may vary between faces. For example, it may be better to check the number of edges first, if the template face has a large number. By contrast, another template face may have an untypical geometry type making that the first choice property.

The method may analyse potential rotational symmetry of the template, which as well as providing useful additional output information and a superior choice of coordinate frame, also allows an important optimisation of the later search. To determine potential symmetry, the template is fully matched against itself using a fast match procedure and with an exact geometric check, described hereinafter. The method may include steps of adjusting the boundary, choosing a start face and edge, choosing a coordinate frame, building a graph, analysing for symmetries, gathering candidate faces, finding matches, in addition to a fast matching procedure and an exact geometric check. The template is searched for all candidate start face and edge pairs matching the local properties of the real start face and edge. This fast match procedure is applied to each of these candidate faces and edges and the total number of matches is used to infer any rotational symmetry of the template and possibly improving on the choice of coordinate frame. If there is only one match, this generally implies that there is no rotational symmetry.

However, a further check is needed to see if an axial symmetry exists. This further check is for a common axis. A single match with no common axis implies no symmetry. The single X direction remains. For general, non-rotational, templates of this type, the coordinate frame is arbitrary, but for the benefit of downstream applications, some special cases can be applied. For example, in the example sample C shown in FIG. 5 the Z axis is chosen as the common sweep direction of the boundary faces or the direction of face 5.

TABLE 2

|  | Sample | | | | |
| --- | --- | --- | --- | --- | --- |
|  | 1 | 2 | 3 | 4 | 5 |
| Self Match 1 | 1 | 2 | 3 | 4 | 5 |

The sample of FIG. 6 has five faces 31, 32, 33, 34, 35. FIG. 6 and table 3 illustrate a single match with a common axis 36 which implies axial symmetry. In this case the X direction is arbitrary and so does not aid clone detection and is ignored. The number of X directions is set to 0.

TABLE 3

|  | Sample | | | | |
| --- | --- | --- | --- | --- | --- |
|  | 31 | 32 | 33 | 34 | 35 |
| Self Match 1 | 31 | 32 | 33 | 34 | 35 |

FIGS. 7a and 7b and table 4 illustrate N matches which implies N fold rotational symmetry. FIG. 7a shows an initial coordinate frame and seven faces 41 to 47. The rotation axis may be calculated as the common axis of rotation of the transforms and the angle of rotation as 360/N. FIG. 7b shows an adjusted multiple coordinate frame and self mappings. The origin is improved by projecting onto the rotation axis, the Z direction is improved to be that of the rotation axis, as can be seen in FIG. 7b. The N mappings are stored in the template, and each needs an X direction. The first X direction is recalculated to pass through the origin and be perpendicular to the Z direction, with the remaining freedom being less important. However, this may be chosen to make it point to a vertex or significant point. The other N-1 X directions are successive rotations of the first.

TABLE 4

| Sample | 41 | 42 | 43 | 44 | 45 | 46 | 47 | |
| --- | --- | --- | --- | --- | --- | --- | --- | --- |
| Self Match 1 | 41 | 42 | 43 | 44 | 45 | 46 | 47 | x1 |
| Self Match 2 | 42 | 43 | 44 | 45 | 46 | 41 | 47 | x2 |
| Self Match 3 | 43 | 44 | 45 | 46 | 41 | 42 | 47 | x3 |
| Self Match 4 | 44 | 45 | 46 | 41 | 42 | 43 | 47 | x4 |
| Self Match 5 | 45 | 46 | 41 | 42 | 43 | 44 | 47 | x5 |
| Self Match 6 | 46 | 41 | 42 | 43 | 44 | 45 | 47 | x6 |

An error check is provided in that no match in the fast match step implies an error, as the template must match itself at least with the same choice of start face and edge. The faces from the template itself are omitted when gathering faces from the results, but the environment is searched for a 'candidate list' of face and edge pairs matching the start face and edge from the template according to the local fast properties stored. This is a new search of the whole environment, minus the actual start face and edge, looking for matches of start face and edge. For each face and edge pair remaining in the 'candidate list', the 'fast matching procedure' is performed resulting in a set of face mappings. The 'exact geometry check' is performed to find which of these mappings is geometrically correct and if an exact geometric match is found, then a clone is formed with the mapping returned from the fast match procedure and the coordinate frame and transform returned from the exact geometric check.

If the template has Nfold symmetry, then only 1 of the N possible mappings will have been returned from the fast match procedure. This is a benefit of this approach as the N-1 remaining mappings may now be inferred from the 1 found mapping and the N self-mappings found within the template as part of the symmetry check. Each of these additional mappings also gives rise to an additional X direction and transform which can also be calculated. The faces of the found clone are removed from the candidate list.

An exact geometric check is used in the algorithm to determine whether a candidate mapping from template faces to candidate faces is an exact geometric match, ignoring the boundary edges. A coordinate frame is formed from the mapped candidate faces using the same procedure as for the template on the corresponding mapped entities in the candidate. The transform from template to candidate can now be calculated from the coordinate frame of the candidate relative to that of the template.

Each candidate face's surface geometry is compared to that of the corresponding template face with the transform applied. All surfaces must match. Note that this check does not include edges and so does not enforce exact match at the boundary, which is as required. If this test fails, then the candidate is rejected.

The requirement from the high level algorithm, of the fast graph matching procedure, is that it rapidly determines whether a candidate start face and edge have a neighbourhood of faces that match to the template topologically and also according to a number of fast local property checks. The matching requirement at the boundary is less strict with the number of boundary regions required to match but not the number of boundary edges or their properties. The example of FIG. 8 and table 5 shows a sample S1, with faces F1, F2, F3, F4, F5 and clone C1 with faces F6, F7, F8, F9, F10. In this case, a match would be expected as there is a single boundary region in both the sample and the clone, despite the number of edges being different.

TABLE 5

| | Sample | | | | |
|---|---|---|---|---|---|
| | F1 | F2 | F3 | F4 | F5 |
| Clone | F6 | F7 | F8 | F9 | F10 |

Successful matches may yield multiple mappings from the template faces to candidate faces. As each candidate element (face, edge, or loop) is encountered it is checked against the properties stored in the template graph at the build graph stage.

As each candidate face is encountered it is added to a mapping that is built up incrementally as matching proceeds.

Figure 9:
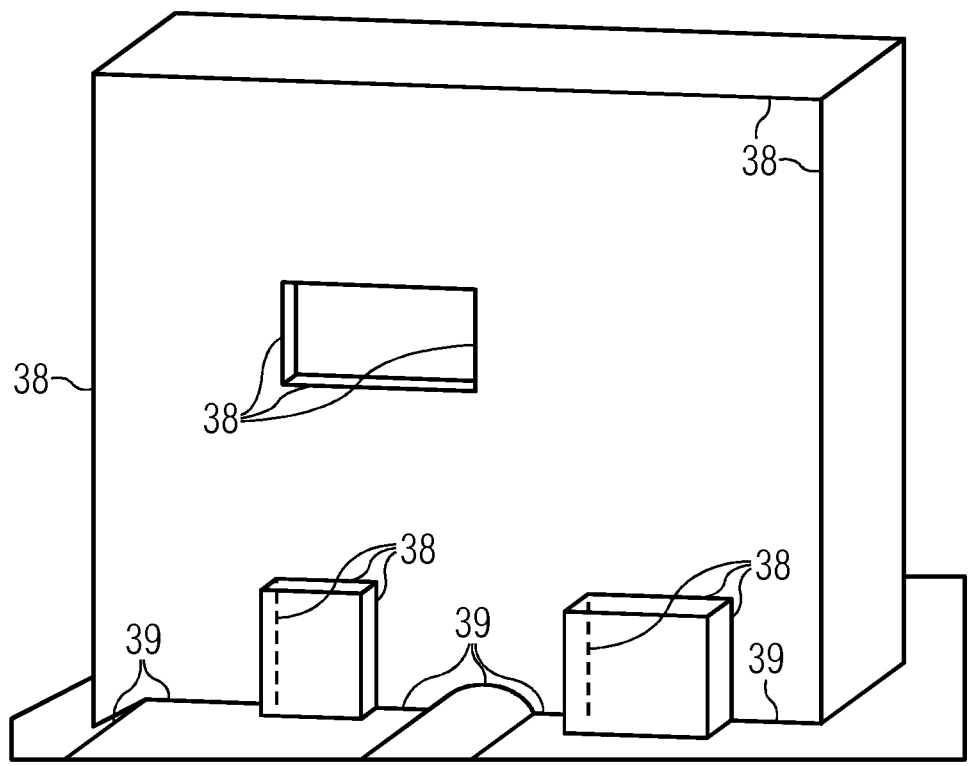
FIG. 9 provides more detail in accordance with the disclosed embodiments.

A connected chain of non-boundary edges is referred to as an 'internal segment' and a connected chain of boundary edges is referred to as a 'boundary segment'. An example is illustrated in FIG. 9, showing internal segments 38 and external segments 39.

Figure 10:
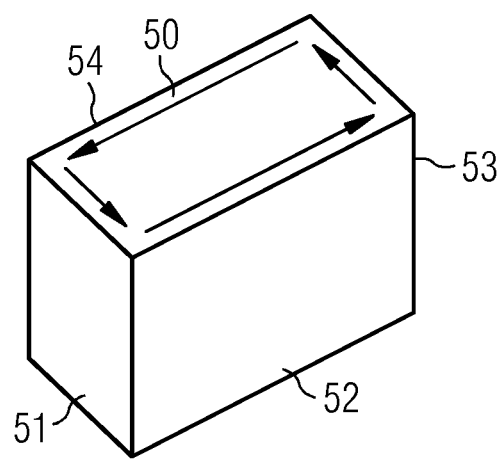
FIG. 10 illustrates an example of applying deterministic matching in an exemplary method in accordance with the disclosed embodiments.
Figure 11:
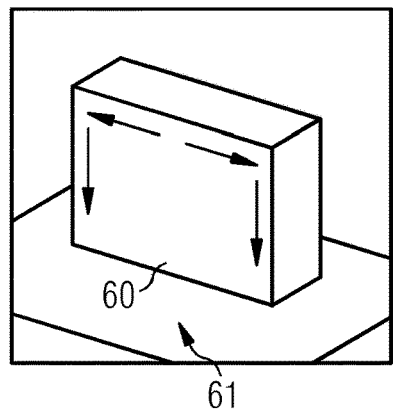
FIGS. 11 and 12 illustrate an example of the effect of differences in numbers of edges in an exemplary method in accordance with the disclosed embodiments.

A deterministic matcher is used as the core graph matching algorithm. It can be used for cases where a unique path can be constructed through the template. This algorithm is seeded with a face of the template, and one of its edges, along with a similar candidate face/edge pair. The hypothesis being that the candidate face/edge pair are part of a successful match. The algorithm uses the edges to identify the adjacent faces, which form a new candidate mapping. These faces may also be added to the processing stack for further edge comparisons. The method then proceeds around the loop of the first face 50, as shown in FIG. 10, checking the edges and adding in the new faces 51, 52, 53, 54 as appropriate. Internal faces (i.e. faces that are only connected to other template faces) should have a consistent number of edges. Therefore, as the method walks around the loops of the template and candidate faces, the loops should both return to their starting points consistently. If not, the candidate is deemed inconsistent and rejected. Once the loop of the face is complete, the algorithm proceeds to the next face in the stack. The starting edge is the one that was used to reach the face. This keeps the template and candidate walks consistent.

Figure 12:
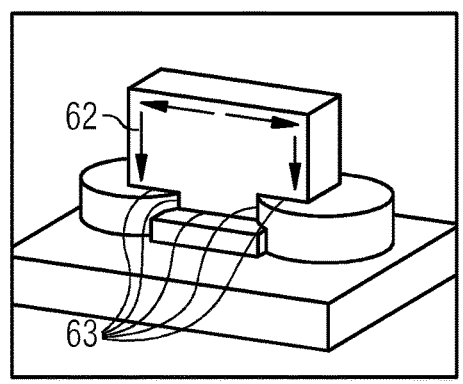
Figure 13:
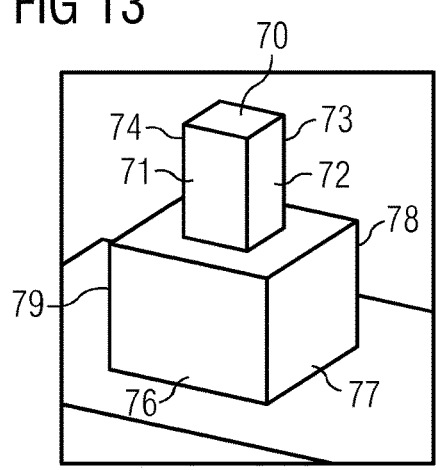
FIG. 13 illustrates the effect of multiple loop matching, in accordance with the disclosed embodiments.

Boundary faces add an extra complication to this algorithm, as the boundary segments, i.e. connected chain of edges at the boundary, are permitted to alter. In one embodiment, an example template in FIG. 11 and a potential candidate in FIG. 12 are expected to match. The complication comes because the boundary segment of face 60 in the template has one edge 61, whilst the candidate 62 has five edges 63 at that point. Clearly, propagating around the loop would result in inconsistencies due to a differing number of edges. To avoid this issue, the deterministic matching algorithm stops walking around the loop when it reaches a boundary segment in the template. It then returns to its starting edge (the edge through which it propagated onto the face) and continues in the opposite direction.

For many templates, where each face's internal edges are all connected, it is possible to reach them all in a deterministic manner and so the deterministic matching is sufficient. However, there are two situations where the internal edges are not all connected and require the algorithm to branch. The first is when a face has multiple loops (multiple loop branching) and the second is when there are multiple boundary segments (multiple boundary segment branching). For the example of multiple loop branching, the deterministic matching algorithm proceeds around the template and proceeds around the candidates by walking the loops and stepping onto the new faces. However, if a face has multiple loops, this algorithm needs to be able to step from one loop to the other. The complication here is that, from a topological viewpoint, it is not possible to know which edge in the second loop to step onto. This issue is illustrated in the example template in FIG. 13 and table 5 below. Starting from face 70, deterministic matching can propagate in a consistent and repeatable manner for the first five faces 70, 71, 72, 73, 74. However, face 75 has two loops, the second of which has four edges. Therefore, there are four potential starting edges for the next part of the graph. The matching algorithm has to test all four possibilities. Due to the rotational symmetry of the model, all of these possibilities will result in a successful mapping. Assuming a given start edge, the resulting four mappings are provided in the table below.

TABLE 6

| Template | Mapping 1 | Mapping 2 | Mapping 3 | Mapping 4 |
|---|---|---|---|---|
| 70 | 70 | 70 | 70 | 70 |
| 71 | 71 | 71 | 71 | 71 |
| 72 | 72 | 72 | 72 | 72 |
| 73 | 73 | 73 | 73 | 73 |
| 74 | 74 | 74 | 74 | 74 |
| 75 | 75 | 75 | 75 | 75 |
| 76 | 76 | 77 | 78 | 79 |
| 77 | 77 | 78 | 79 | 76 |
| 78 | 78 | 79 | 76 | 77 |
| 79 | 79 | 76 | 77 | 78 |

When used in the symmetry checking part of the algorithm, all four of the edges around face 70 are tested so giving sixteen acceptable topological mappings, then this is cut down to four by the exact geometric test to yield four mappings and imply four-fold symmetry. With this knowledge of the symmetry, the second use of this matching within the clone finding only needs to return one mapping and the other valid mappings are inferred as described above. Multiple loop branches are easily found as they are defined as any face in the template which has more than one loop. If a face with multiple loops is encountered, the matcher adds the "next" loop as a branch. The "next" loop is arbitrarily chosen as one of the unprocessed template loops, which is used as the next to compare. The ordering of the loop branches may be optimised to improve efficiency.

Figure 14A:
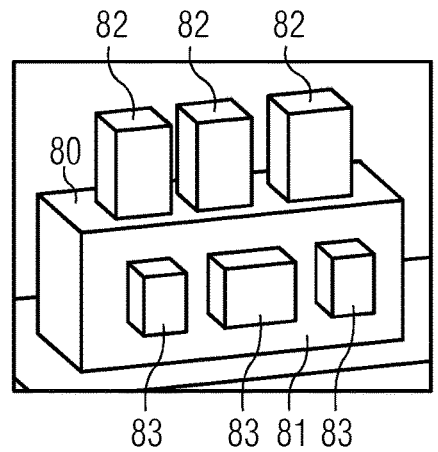
FIGS. 14a, 14b and 14c illustrate the effect of multiple loop branching, in accordance with the disclosed embodiments.
Figure 14B:
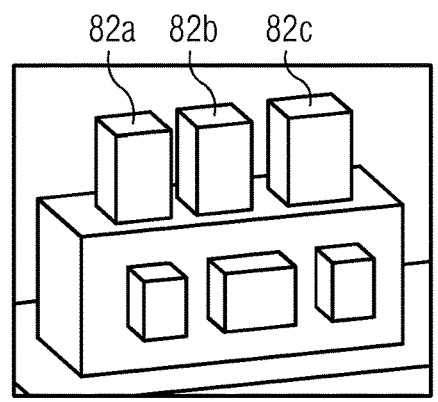
Figure 14C:
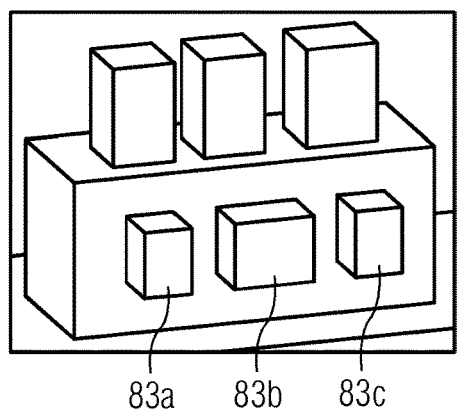
Figure 15A:
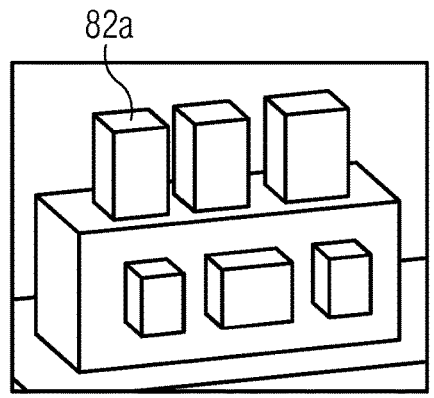
FIGS. 15a, 15b and 15c provide more detail of the embodiment of FIGS. 14a, 14b and 14c, in accordance with the disclosed embodiments.
Figure 15B:
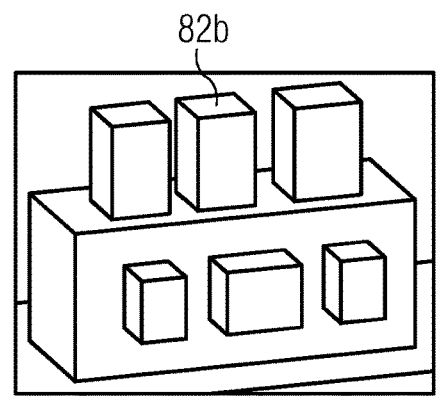
Figure 15C:
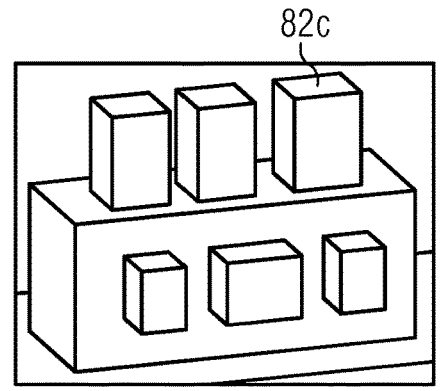

In the case of multiple loop branching with dependency, there is a dependency between loops on the same face, so only one of these will be chosen as a branch after each deterministic match. The example of FIGS. 14a to 14c shows how the matching of the loops on the different faces can be treated independently, but the loops within each face must be processed in a dependent manner. The sample in FIG. 14a has faces 80, 81 and protrusions 82, 83. Two multiple loop faces on the main block, the top face 80 and front face 81 can be treated independently, so are processed as separate, independent branches. Within each branch, the start of the "next" loop could be any one of the twelve unprocessed faces, i.e. for the face 80 branch, the sides of protrusions 82a, 82b, 82c as shown in FIG. 14b and for the face 81 branch, the sides of the protrusions 83a, 83b, 83c as shown in FIG. 14c. As can be seen in FIGS. 15a to 15c, each of the faces 82a results in a successful topological matching of that sub-graph, leaving the remaining eight candidate edges 82b, 82c for the loop after that and four candidate edges 82*c* for the next with the number of mapping combinations multiplying at each stage. Similarly for protrusions 83 and candidate edges 83*a*, 83*b*, 83*c*.

This example is chosen with a great many equal edge lengths, in order to draw out the fact that the local-only property checks, such as edge length, can still yield a great many mappings on certain models. In practice, it is possible to remove this type of branching in many cases by adding further 'semi local' geometric checks. For example, the deterministic matching could determine nearest edges and/or vertices to link one loop to another, extending the walk rather than branching. Additionally, when a large number of combinations cannot be avoided, the mappings may be stored in a tree structure, which is more compact and can be geometrically checked in a more efficient hierarchical manner. Alternatively, some of the exact geometric checking may be performed within the graph matching, with a balance between cutting down the generated mappings versus adding computation time to the fast matching. The resulting performance of the algorithm is the driving factor in tuning this aspect of the method to a particular domain.

Figure 16A:
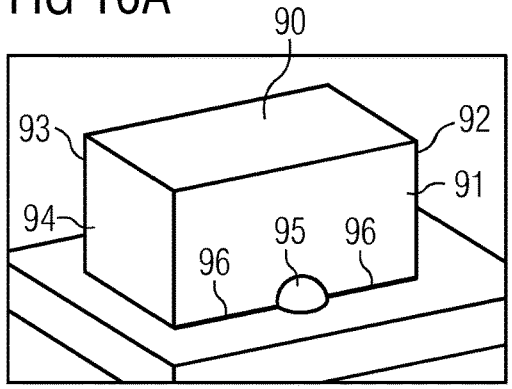
FIGS. 16a and 16b illustrate the effect of multiple boundary segment branching, in accordance with the disclosed embodiments.
Figure 16B:
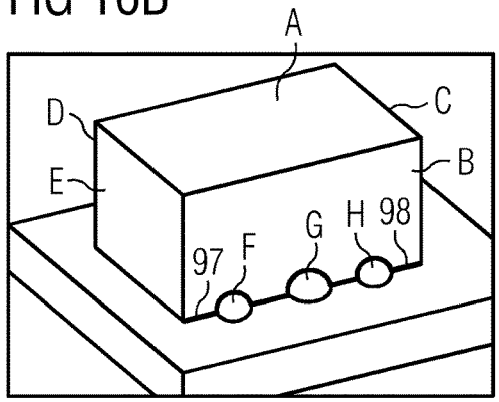
Figure 17:
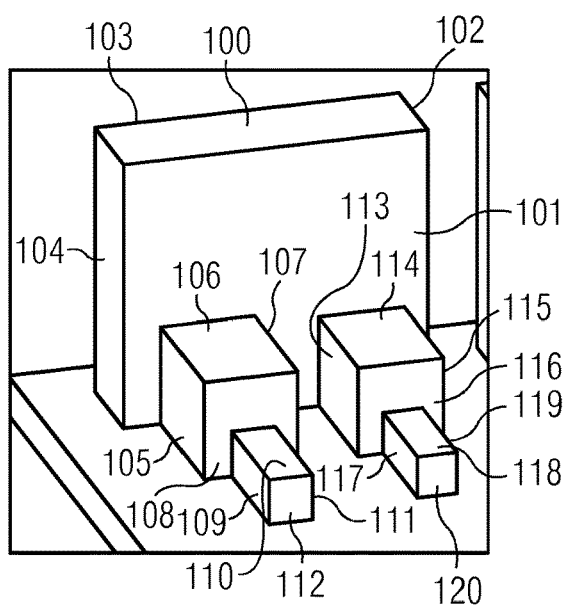
FIG. 17 illustrates the effect of dependency on the embodiment of FIGS. 16a and 16b, in accordance with the disclosed embodiments.
Figure 18A:
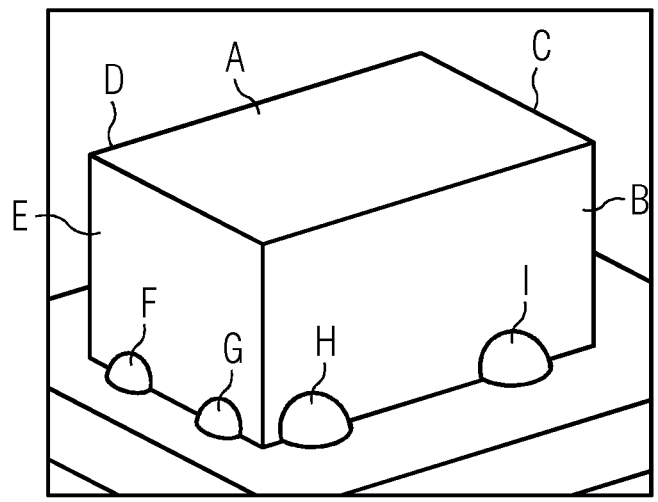
FIGS. 18a and 18b illustrate combined mapping, in accordance with the disclosed embodiments; and, FIGS. 19a, 19b and 19c illustrate the effect of features which generate cyclic graphs, in accordance with the disclosed embodiments.
Figure 18B:
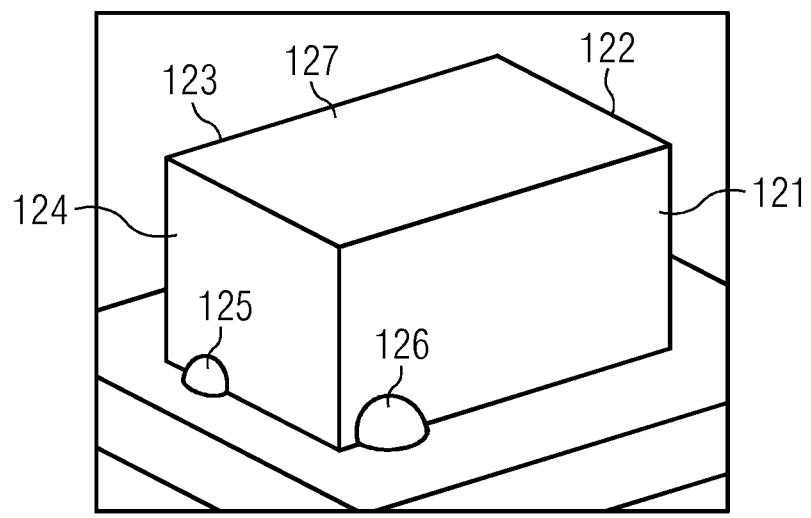

FIGS. 16*a* and 16*b* and table 7 are examples of multiple boundary segment branching. In FIG. 16*a*, boundary segments 96 of face 91 can be seen in an example illustrating a template where an additional sphere, face 95, means that face 91 has two boundary segments. When the deterministic algorithm propagates onto face 91 from any of faces 90, 92 or 94, it will process the edges in loop order, and reverse loop order until it reaches a boundary segment. The method never propagates onto face 95. Although the template only has one edge in each of the boundary segments, a successful candidate may have several edges. When comparing with candidate faces as shown in FIG. 16*b*, the method needs to branch to discover a match for face 95. The set of potential edges to check extends from the left hand side of sphere F to the right hand side of sphere H. The algorithm needs to test all five of these possibilities and should discover three topologically correct matches. There is no need to test the edges 97, 98 immediately before F and after H, as boundary segments are expected to consist of at least one edge. Three topologically correct mappings are output as indicated in table 7 below.

TABLE 7

| Template | Mapping 1 | Mapping 2 | Mapping 3 |
| --- | --- | --- | --- |
| 90 | A | A | A |
| 91 | B | B | B |
| 92 | C | C | C |
| 93 | D | D | D |
| 94 | E | E | E |
| 95 | F | G | H |

Multiple boundary segment branch points can be dependent, as there could be several sub-graphs originating from the same face-loop. The location of one of these is dependent on the previous one. For example, the template shown in FIG. 17 has such a boundary face (face 101) with two remaining internal segments connected to it at the boundary, still to be matched. After successfully matching faces 100 to 104, an initial attempt is made to search for the internal segment connecting to faces 105, 106 and 107, as the potential candidates for the internal segment connecting to 113, 114 and 115 are dependent on the location of that first internal segment. The algorithm needs to repeatedly call the deterministic matching algorithm with the various candidate starting edges for the next internal segment. Once the deterministic method has found a successful match for the sub-graph, i.e. faces 105, 106, 107 and 108), it then adds the next internal segment, connecting to faces 113, 114, 115 and 116, as another branch. During the matching of faces 105, 106, 107 and 108, it will also encounter another branch at face 108 and so on.

When a branch is reached, the candidate edges are collated, and then explored. For multiple loop branches, the function can stop once a correct match for the branch has been found, as the mappings that result from alternative candidates can be inferred. As there may be multiple successful candidates, all these different mappings must be compiled. For the independent branches, the resulting successful mappings need to be merged, which involves producing a complete set that includes every combination from each sub-branch. To see this, consider the example template of FIG. 18b with faces 121, 122, 123, 124, 125, 126, 127. Spherical faces 125 and 126 result in boundary branches, which are independent as they occur on different faces. When this model is being matched to the candidate shown in FIG. 18*a*, as indicated in table 8, each of the branch points finds two successful matches. The branch from face 121 produces two mappings, where face 126 maps to either H or I. Likewise, the branch from face 124 produces two mappings for face 125, mapping to either face F or G. Merging the options from these independent branches involves forming all combinations of the options in each branch. The two options in the branches result in 2×2=4 possible combinations for the mappings of faces 125 and 126 (HF, HG, IF, IG). All four of the mappings provide the same face pairs for the first five faces.

TABLE 8

| | Branch 1 | | Branch 2 | |
| --- | --- | --- | --- | --- |
| Template | Mapping 1 | Mapping 2 | Mapping 1 | Mapping 2 |
| 127 | A | A | A | A |
| 121 | B | B | B | B |
| 122 | C | C | C | C |
| 123 | D | D | D | D |
| 124 | E | E | E | E |
| 125 | N/A | N/A | F | G |
| 126 | H | I | N/A | N/A |

Figure 19A:
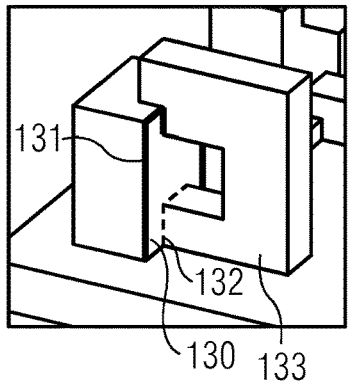
Figure 19B:
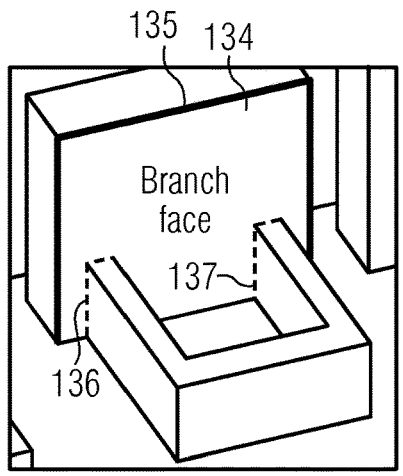
Figure 19C:
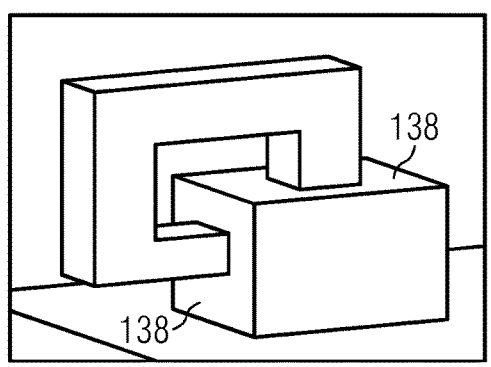

A further complication concerns features that result in cyclic graphs, as illustrated in FIGS. 19*a*, 19*b* and 19*c*. The example template of FIG. 19a contains a potential branch face 130, as the template has two distinct internal segments 131, 132, segment 131 indicated by a solid line and segment 132 indicated by a dotted line. However, the right-hand component 133 of the feature enables a different route to the second segment 132, so this model can be matched by purely deterministic means. Therefore, when exploring branches, it is necessary to verify that the internal segment being sought has not already been found. In the example of FIG. 19*b*, a template is shown with two sub-graphs. The branch face 134 has three separate internal segments segment 135 shown by a solid line and segments 136, 137 shown by a dotted line, the three segments indicating two dependent branches. However, exploration of the first branch deterministically discovers the third internal segment 137. In the example of FIG. 19c is shown another template with two branch faces 138. Each sub-graph provides two independent branches. However, exploration of the first branch will discover the second branch deterministically.

The method is fast to both find clones and also reject non-clones for a number of reasons. Combining a deterministic walk with branching means the potential search tree is minimal. The use of local properties further reduces the actual search tree drastically. The graph matching is exhausted before any geometric tests are performed, which may be expensive in terms of CPU time and hence overall time taken. Analysis of the input allows symmetric clones to be inferred rather than explicitly found, reducing the search space. Judicious choice of start faces and edges reduces the number of matches that are attempted. The topology and geometry split allows diagnostic output in cases where clones might be expected but are not returned due to partial topology matches or partial geometry matches. The topology and geometry split allows a number of additional features to be incorporated, as explained in more detail below. The return of mapping and coordinate frame information means that the output is readily usable in geometric pattern identification. The method also produces consistent coordinate frames and transforms which are useful for downstream applications. The symmetry detection, as well as speeding up the processing, gives rise to a superior coordinate frame in rotationally symmetric cases along with all the mappings which, again, will likely be useful downstream.

There are numerous extensions and expansions that may be used with the method disclosed. The scope may be increased to include templates comprising multiple connected faces sets. The choice of start face/edge may be tuned for each template, for example trying to choose the start/edge pair that maximises the portion of the graph that can be visited deterministically. This increases the chance of rejecting a candidate without branching. The choice of start face/edge may be tuned for a particular environment, taking into account any knowledge of likely frequency of different properties for a particular domain or actually pre-scanning the presented environment to ascertain this. This is beneficial when the same environment is searched to many different templates. Some of the boundary, or all of the boundary, may be important, so flexibility can be added to require an exact match on some or all of the boundary edges.

Some exact geometric checks may be replaced by logical checks. For example internal treatment faces, such as blends or chamfers, can be checked by type and parameters rather than geometry, allowing for more tolerant matches as well as allowing variations of the parameters (blend radii for example) in these areas. Geometry checking can be made tolerant to allow for import from different systems. The topological and geometric division of the method allows for possible recognition of similar topological clones with some degree of geometric variation, for example: overall size (scale) or particular parametric variations in a family of features. Adjustment of the topology and geometry checking allows for symmetric or mirrored features to be identified. A partial matcher may be implemented that allows a threshold of matching to be required and the system indicates which portion of the template matches. There may be further special cases for the choice of Z axis direction in the non-symmetric cases.

A particularly helpful feature for product design allows inverted matches, so that a template of a part may be used for finding the correct corresponding part, such as a peg for a particular hole, or a feature on a mould that matches with features on the part. The method may be utilised on the fly, within any application that can make use of similarity. In this context, the clones do not have to be permanently labelled, but are discovered as needed and may vary and evolve as the model is progressively built. Quite simply, the disclosed method provides a powerful selection tool, being particularly effective at finding samples which are substantially, but not totally topologically equal because the method is able to reject unsuitable samples efficiently.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 1 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle.

The invention claimed is:

1. A method of identifying geometric clones in a computer aided design (CAD) modelling system comprising at least a processor and memory, the method comprising:

choosing, by the processor of the CAD modelling system, a template of a geometric form and generating and storing a map of the template in the memory of the CAD modelling system, wherein the template represents faces and edges of a surface geometry of the geometric form, and wherein generating the map of the template comprises exploring template edges and faces sequentially from a template start point of a start face and a start edge to detect other template edges and faces until returning to the template start point or reaching a branch in the template, wherein exploring the template edges and faces sequentially from the template start point comprises following a boundary of the start face from the template start point sequentially in a looped direction around the start face;

identifying, by the processor of the CAD modelling system, a candidate geometric form in the CAD modelling system;

exploring the identified candidate geometric form, exploring the identified candidate geometric form comprising following a boundary of a start face of the candidate geometric form from a start point sequentially in a looped direction around the candidate geometric form start face until returning to the start point or reaching a branch;

generating, by the processor of the CAD modelling system, a map of the explored candidate geometric form;

comparing, by the processor of the CAD modelling system, the map of the explored candidate geometric form with the map of the template;

labelling, by the processor of the CAD modelling system, the candidate geometric form as a clone if it matches a predetermined portion of the template;

applying, simultaneously by the processor of the CAD modelling system, a modification to the template and the candidate geometric form labelled as a clone; and displaying a representation of the modified template in the CAD modelling system.

2. A method according to claim 1, further comprising, if the comparison exceeds a tolerance range terminating the exploring, or if the comparison falls within the tolerance range, saving the map in the memory and labelling the candidate geometric form as a clone.

3. A method according to claim 1, further comprising, if the exploring reaches a branch, reversing direction, returning through the start point and continuing until the start point, or a branch is reached in the reverse direction.

4. A method according to claim 1, further comprising, checking for branches and repeating the exploring and comparison steps for each branch.

5. A method according to claim 1, further comprising associating labelled clones in groups and processing the labelled clones in their groups.

6. A method according to claim 1, further comprising identifying geometric forms which are an inverse, or mirror of the template, or which share symmetry with the template, or which are scaled relative to the template and labelling these as geometric clones.

7. A method according to claim 1, wherein the method requires an exact match on some or all boundary edges.

8. A method according to claim 1, wherein the method comprises checking internal treatment faces by type or parameters.

9. A method according to claim 1, wherein the template represents faces or edges of a modelled product part.

10. A method of identifying geometric clones in a computer aided design (CAD) modelling system comprising at least a processor and memory, the method comprising:

choosing, by the processor, a template representing faces and edges of a surface geometry of a sample;

generating and storing a map of the template in the memory, generating the map of the template comprising exploring template edges and faces sequentially from a template start point of a start face and a start edge to detect other template edges and faces until returning to the template start point or reaching a branch in the template, wherein exploring the template edges and faces sequentially from the template start point comprises following a boundary of the start face from the template start point sequentially in a looped direction around the start face;

searching, by the processor, for candidates matching at least a predetermined portion of the template;

labelling, by the processor, the candidates that match at least the predetermined portion of the template as geometric clones;

applying, simultaneously by the processor, a modification to the template and the candidates labelled as a clone; and displaying a representation of the modified template or candidates labelled as a clone in the CAD modelling system.

11. A method of simulating modifications to construction of a multi-part product in a computer aided design (CAD) system, the method comprising:

modelling, by a processor, the product using a model in the CAD system;

selecting, by the processor, one part of the multi-part product;

identifying, by the processor, geometric forms comprising geometric clones, or inverted geometric clones of the selected part in the model, wherein the identifying comprises choosing a template representing faces and edges of a surface geometry of the selected part, and generating and storing a map of the template in a memory, generating the map of the template comprising exploring template edges and faces sequentially from a template start point of a start face and a start edge to detect other template edges and faces until returning to the template start point or reaching a branch in the template, wherein exploring the template edges and faces sequentially from the template start point comprises following a boundary of the start face from the template start point sequentially in a looped direction around the start face;

labelling, by the processor, identified clones;

applying, simultaneously by the processor, a modification to the part and to the labelled geometric clones; and providing, by the processor, a representation of the modified product on a display of the CAD system.

12. A method according to claim 11, wherein the identifying further comprises:

identifying, by the processor, a candidate geometric form in the product;

exploring the identified candidate geometric form, exploring the identified candidate geometric form comprising following a boundary of a start face of the candidate geometric form from a start point sequentially in a looped direction around the candidate geometric form start face until returning to the start point or reaching a branch;

generating, by the processor, a map of the explored candidate geometric form;

comparing, by the processor, the map of the explored candidate geometric form with the map of the template, and wherein, if the comparison falls outside a tolerance range, terminating the exploring, and if the comparison falls within the tolerance range, saving the map in the memory and labelling, by the processor, the candidate geometric form as a clone.

13. A method according to claim 11, wherein the method further comprises identifying geometric forms which are an inverse, or mirror of the template, or which share symmetry with the template, or which are scaled relative to the template and labelling these as geometric clones.

14. A method according to claim 11, wherein the candidate geometric form comprises one of a face, or an edge, or multiple connected face or edge sets.

15. A method according to claim 11, wherein the method requires an exact match on some or all boundary edges.

16. A data processing system comprising at least a processor and accessible memory to implement, in a computer aided design (CAD) system, a method of identifying geometric clones in a model, the data processing system configured to:
 render, on a display of the CAD system, a model of a product having a plurality of parts;
 derive a template representative of faces and edges of a surface geometry of one of the plurality of parts;
 generate and store a map of the template in the memory, the generation of the map of the template comprising exploration of template edges and faces sequentially from a template start point of a start face and a start edge to detect other template edges and faces until returning to the template start point or reaching a branch in the template, wherein the exploration of the template edges and faces sequentially from the template start point comprises following a boundary of the start face from the template start point sequentially in a looped direction around the start face;
 use the template to identify geometrically similar elements in the model;
 label identified elements as geometric clones;
 apply common processing simultaneously to modify the element and the corresponding geometric clones; and
 render, on the display of the CAD system, a modified model of the product.

17. A system according to claim 16, wherein the system comprises a store, or display configured to output the topology of the product.

18. A system according to claim 16, wherein the system is configured to identify geometric clones based on candidates having a similar geometry to the part, or inverse geometry to the part.

19. A non-transitory computer-readable medium encoded with executable instructions that, when executed, cause one or more data processing systems to perform a method of identifying geometric clones in a computer aided design (CAD) modelling system comprising at least a processor and memory, the method comprising:
 choosing, by the processor of the CAD modelling system, a template of a geometric form and generating and storing a map of the template in the memory of the CAD modelling system, wherein the template represents faces and edges of a surface geometry of the geometric form, and wherein generating the map of the template comprises exploring template edges and faces sequentially from a template start point of a start face and a start edge to detect other template edges and faces until returning to the template start point or reaching a branch in the template, wherein exploring the template edges and faces sequentially from the template start point comprises following a boundary of the start face from the template start point sequentially in a looped direction around the start face;
 identifying, by the processor of the CAD modelling system, a candidate geometric form in the system;
 exploring the identified candidate geometric form, exploring the identified candidate geometric form comprising following a boundary of a start face of the candidate geometric form from a start point sequentially in a looped direction around the candidate geometric form start face until returning to the start point or reaching a branch;
 generating, by the processor of the CAD modelling system, a map of the explored candidate geometric form;
 comparing, by the processor of the CAD modelling system, the map of the explored candidate geometric form with the map of the template;
 labelling, by the processor of the CAD modelling system, the candidate geometric form as a clone if it matches a predetermined portion of the template;
 applying, simultaneously by the processor of the CAD modelling system, a modification to the template and the candidate geometric form labelled as a clone; and
 displaying a representation of the modified template, the modified candidate geometric form labelled as a clone, or combinations thereof, in the CAD modelling system.

20. A non-transitory computer-readable medium encoded with executable instructions that, when executed, cause one or more data processing systems to perform a method of simulating modifications to construction of a multi-part product in a computer aided design (CAD) system, the method comprising:
 modelling, by a processor, the product using a model in the CAD system;
 selecting, by the processor, one part of the multi-part product;
 identifying, by the processor, geometric forms comprising geometric clones, or inverted geometric clones of the selected part in the model, wherein the identifying comprises choosing a template representing faces and edges of a surface geometry of the selected part, and generating and storing a map of the template in a memory, generating the map of the template comprising exploring template edges and faces sequentially from a template start point of a start face and a start edge to detect other template edges and faces until returning to the template start point or reaching a branch in the template, wherein exploring the template edges and faces sequentially form the template start point comprises following a boundary of the start face from the template start point sequentially in a looped direction around the start face;
 labelling, by the processor, identified clones;
 applying, simultaneously by the processor, a modification to the part and to the labelled geometric clones; and
 providing, by the processor, a representation of the modified product on a display of the CAD system.

* * * * *